United States Patent [19]
Etheridge et al.

[11] Patent Number: 5,942,927
[45] Date of Patent: Aug. 24, 1999

[54] CLOCK SIGNAL GENERATOR FOR A LOGIC ANALYZER CONTROLLED TO LOCK BOTH EDGES TO A REFERENCE CLOCK SIGNAL

[75] Inventors: Eric P. Etheridge; David J. McKinney, both of Beaverton; Spiro Sassalos; Grigory Kogan, both of Portland, all of Oreg.

[73] Assignee: Tektronix, Inc., Wilsonville, Oreg.

[21] Appl. No.: 08/987,428

[22] Filed: Dec. 9, 1997

[51] Int. Cl.⁶ .................................................. H03K 5/153
[52] U.S. Cl. ............................ 327/158; 327/155; 327/74; 327/161; 327/163
[58] Field of Search ................................. 327/3, 7, 12, 8, 327/142, 157, 147, 146, 152, 156, 153, 276, 74, 155, 158, 161, 162, 163; 331/11, 12; 375/106

[56] References Cited

U.S. PATENT DOCUMENTS

| | | | |
|---|---|---|---|
| 4,922,141 | 5/1990 | Lofgren | 327/158 |
| 4,984,255 | 1/1991 | Davis | 375/106 |
| 5,432,827 | 7/1995 | Mader | 375/576 |
| 5,576,757 | 11/1996 | Frisch | 348/207 |
| 5,734,301 | 3/1998 | Lee | 331/2 |

*Primary Examiner*—Kenneth B. Wells
*Assistant Examiner*—Maria Hasanzadah
*Attorney, Agent, or Firm*—Thomas F. Lenihan

[57] ABSTRACT

A first comparison circuit compares an internally generated clock signal with a reference signal and produces a first error signal in response to timing differences between rising edges of the clock signal and the reference signal. A second comparison circuit compares the internally generated clock signal with the reference signal and produces a second error signal in response to timing differences between falling edges of the clock signal and the reference signal. The first and second error signals are applied to control inputs of a phase shifter chain to control delay in each stage to reduce the timing error with respect to each edge.

8 Claims, 3 Drawing Sheets

CLOCK SIGNAL GENERATOR FOR A LOGIC ANALYZER CONTROLLED TO LOCK BOTH EDGES TO A REFERENCE CLOCK SIGNAL

FIELD OF THE INVENTION

The subject invention concerns clock signal generation in general and specifically concerns a clock generator circuit for producing an internal clock signal which is locked to a reference clock.

BACKGROUND OF THE INVENTION

Modern logic analyzers commonly have a large number of input connections. For example, some prior art logic analyzers may have over one hundred input lines. These input lines are normally connected to processing circuitry which may be realized on a plurality of application specific integrated circuits (ASICs). In order to function properly, the clock signals which control the sampling and processing of the input signals must be common to all the ASICs used. This common clock signal (or reference signal) is typically an externally supplied signal, related to the frequency of the data signals to be acquired. In this method of acquisition, the data signals to be analyzed are acquired synchronously.

High speed asynchronous signal acquisition of analog signals is known from the TDS-500 digital sampling oscilloscope, manufactured by Tektronix Inc., of Wilsonville, Oreg. In that oscilloscope, a relatively very large number of samples are taken of the input waveform, asynchronously, to accurately define the shape of the waveform for processing and display.

It is herein recognized that such high speed sampling of the digital data presented to a logic analyzer would allow the analyzer to more precisely determine the location of the edges of the digital signals, thus better defining the logic states of the input digital data. It is envisioned that such a system would utilize, for example, a 250 MHz clock. Unlike the above mentioned TDS-500 oscilloscope, it is herein recognized that if both edges of that clock were utilized, the sampling rate would be effectively doubled, thus providing the benefits of a 500 MHz clock while employing a lower speed clock.

Unfortunately, two problems immediately arise. The first is, due to limitations in the number of inputs which can be handled on a typical ASIC, multiple ASICs are required. Each ASIC has literally tens of thousands of gates to be driven by the common high speed clock signal. The combined capacitances of the inputs of those gates requires the common clock signal to be amplified significantly to enable it to drive all the gates. This causes a problem because seemingly identical ASICs necessarily exhibit different delays in their internal circuitry. This unfortunate truth results in a clock signal which undesirably occurs at a different time for each ASIC. That is, the amplifier chain delays and distorts the clock signal in relation to the original input clock signal.

The second problem concerns the use of both edges of the clock. In order to do so, it is critical that the clock signal be a square wave (i.e., have equal high and low periods, that is, an equal duty cycle). Unfortunately, it is herein recognized that the amplifier chain also distorts the duty cycle of the high speed clock.

Therefore, the problem to be solved is to ensure that the final high speed clocks used in each of perhaps sixteen different ASICs are substantially identical to each other, in phase, frequency and duty cycle.

SUMMARY OF THE INVENTION

A first comparison circuit compares a clock signal generated in an internal amplifier chain with a reference signal and produces a first error signal in response to timing differences between rising edges of the clock signal and the reference signal. A second comparison circuit compares the internally generated clock signal with the reference signal and produces a second error signal in response to timing differences between falling edges of the clock signal and the reference signal. The first and second error signals are applied to control inputs of the amplifier chain to control delay in each stage to reduce the error with respect to each edge.

DETAILED DESCRIPTION OF THE EMBODIMENT

Figure 1:
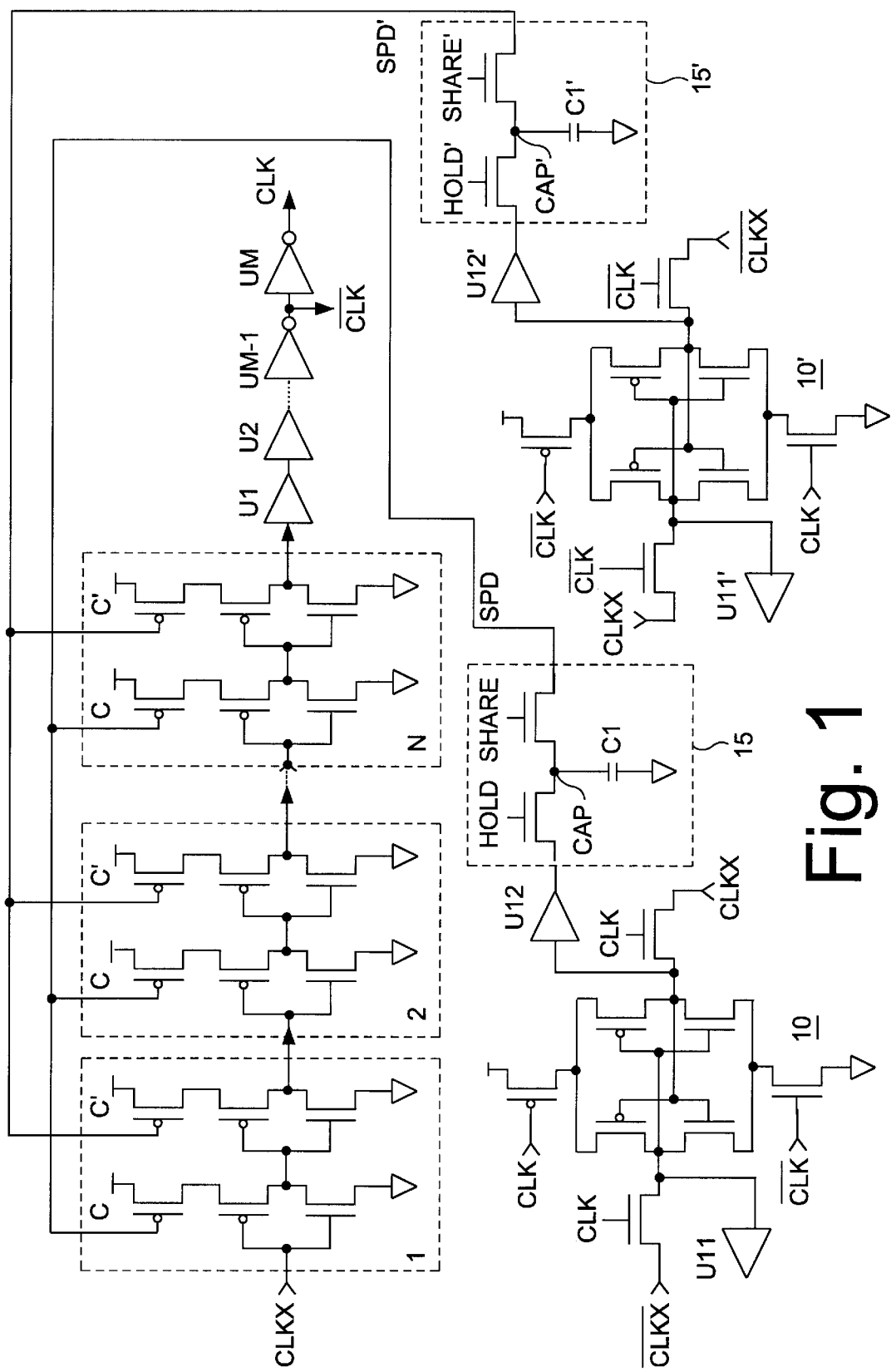
FIG. 1 shows in schematic form apparatus suitable for practicing the invention.

Referring to FIG. 1, an apparatus for locking both edges of an internally-generated clock signal (CLK) to an external reference clock signal (CLKX) is shown.

As noted above, numerous amplification stages are necessary to obtain a clock signal suitable for driving a large number of inputs, which may number in the tens of thousands. An N-stage phase shifter chain is shown in FIG. 1 and comprises cascaded phase shifter stages 1, 2, . . . N. The output clock signal may be tapped off between additional buffer amplifier stages U1, U2, etc., to further divide the clock signal in, for example, 50 picosecond steps. The final amplifiers UM and UM-1 are configured as inverters and produce the CLK signal and its inverse (CLK-BAR).

It is the final clock signals CLK and CLK-BAR which are synchronized with the external reference signal CLKX. It is herein recognized that it is unnecessary to compare all the final clock signals of perhaps sixteen ASICs to each other in order to synchronize them. All that is required to accomplish this task is to synchronize each of them to the common external reference signal, thereby "automatically" synchronizing them to each other. It should be noted at the outset that the above-identified Tektronix oscilloscope employed circuitry to lock one edge of the internally generated clock signal to an external reference. It did not face the additional problems of synchronizing hundreds of inputs spread across multiple ASICs, nor the problem of locking both edges.

In comparison circuit 10, external reference signals CLKX and CLKX-BAR are sampled in response to signals CLK and CLK-BAR in order to produce an error signal representing the time difference between the falling edges of CLK and CLKX. Similarly, in comparison circuit 10', external reference signals CLKX and CLKX-BAR are sampled in response to signals CLK and CLK-BAR in order to produce an error signal representing the time difference between the rising edges of CLK and CLKX. Circuits 10 and 10' are identical except that the senses of the signals CLK and CLK-BAR applied to each input differ. Buffers U11 and U11' serve no function other than to provide symmetrical loading of the comparison circuits.

The outputs are taken via buffers U12 and U12' respectively, and applied to charge pumps 15 and 15'.

Charge pumps 15 and 15' are identical and therefore only charge pump 15 need be described. Charge pump 15 comprises an input transistor, a capacitor C1, and an output transistor. The input signal is applied to capacitor C1 in response to a control signal HOLD. The signal developed across capacitor C1 is applied to the output in response to a second control signal SHARE. Control signals HOLD and share are related to internal clock signal CLK and are generated in a straightforward fashion in circuitry which is not shown for simplicity. The output signal SPD (i.e., speed) is representative of the falling-edge error noted in comparison circuit 10 and is applied to control input C on each of the amplifiers in the chain. Similarly, the output signal SPD' is representative of the rising-edge error noted in comparison circuit 10' and is applied to control input C' on each of the amplifiers in the chain.

Figure 2:
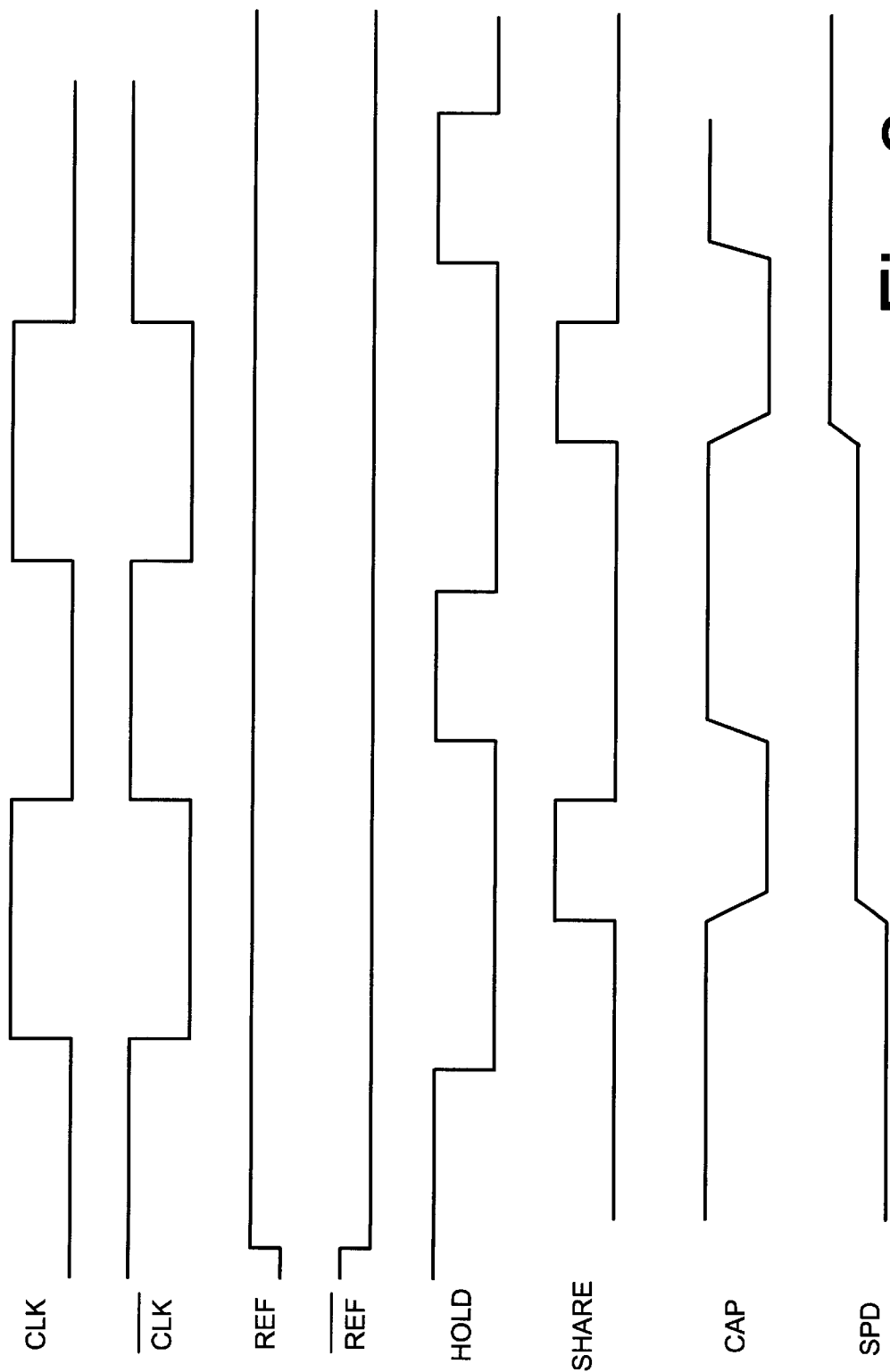
FIG. 2 shows waveforms useful in understanding the invention.

In FIG. 2, input signals CLKX and CLKX-BAR have been replaced by a constant-high level signal REF and a constant-low level signal REF-BAR for simplicity of understanding. The waveforms illustrate the relationship of the internally-generated clock signals CLK and CLK-BAR to the sampling signals HOLD and SHARE. FIG. 2 also shows the error signal CAP developed across capacitor C1, and the output signal SPD. In operation, the falling edge sampler (comparison circuit 10) tracks the reference signal (normally CLKX) when control signal CLK is at a high level, and amplifies the reference signal when control signal CLK goes low.

Figure 3:
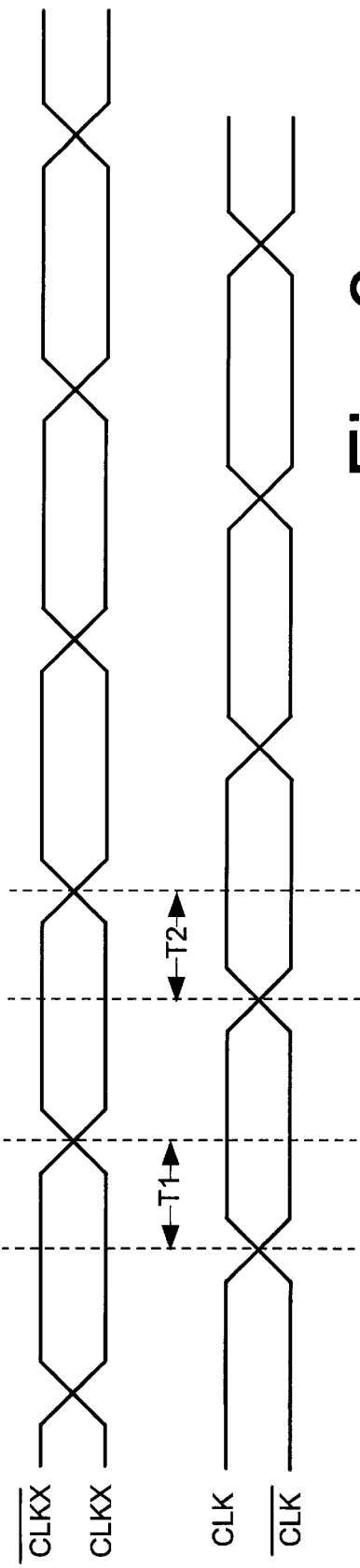
FIGS. 3 and 4 show additional waveforms useful in understanding the invention.

Referring to FIG. 3, a time difference T1 exists between the falling edges of internal clock signal CLK and the external reference clock CLKX. These two signals must be synchronized in each ASIC for the logic analyzer to function properly. Similarly, a second time difference T2 exists between the rising edges of internal clock signal CLK and the external reference clock CLKX. Timing errors T1 and T2 are not necessarily equal to each other, thereby introducing a duty cycle error, as well.

The phase-shifter chain comprises inverters having a top PMOS device coupled to a control input C or C' for receiving the error-correction signal SPD or SPD' from a corresponding charge pump. The first phase shifter inverter in the chain is driven by reference clock signal CLKX.

The CLKX falling-edge propagation delay is controlled by the inverters coupled to the C inputs. For example, the falling edge of signal CLKX produced at the output of the first phase shifter inverter of phase shifter number 1 will precharge high the input of the second phase shifter inverter of phase shifter number 1. The precharge delay is controlled by the top PMOS device of the first phase shifter inverter in response to control signal SPD. As the input to the second phase shifter inverter of the phase shifter number 1 begins to rise, the bottom NMOS device switches on discharging the output of phase shifter number 1 to ground potential. The above described operation is replicated in all following stages as well. Thus, the falling edge of the final stage output signal will become aligned to the falling edge of input reference signal CLKX at a corresponding level of control signal SPD. Similarly, the rising-edge propagation delays can be controlled in response to control signal SPD' as applied to the top PMOS device of the second phase shifter inverter in each phase shifter in the chain. Thus, the rising edge of the final stage output signal will become aligned to the rising edge of input reference signal at a corresponding level of control signal SPD'.

In the example shown in FIG. 3, the falling edge of internally-generated clock signal CLK is to the left of external reference signal CLKX. The error signal SPD will cause the top PMOS device in the corresponding inverter of amplifier 1 (and all succeeding amplifier stages) to become more resistive, thereby reducing time difference T1 by moving the falling edge of signal CLK closer to the falling edge of signal CLKX. Rising edge propagation delay is controlled in the same fashion to align the rising edges.

Figure 4:
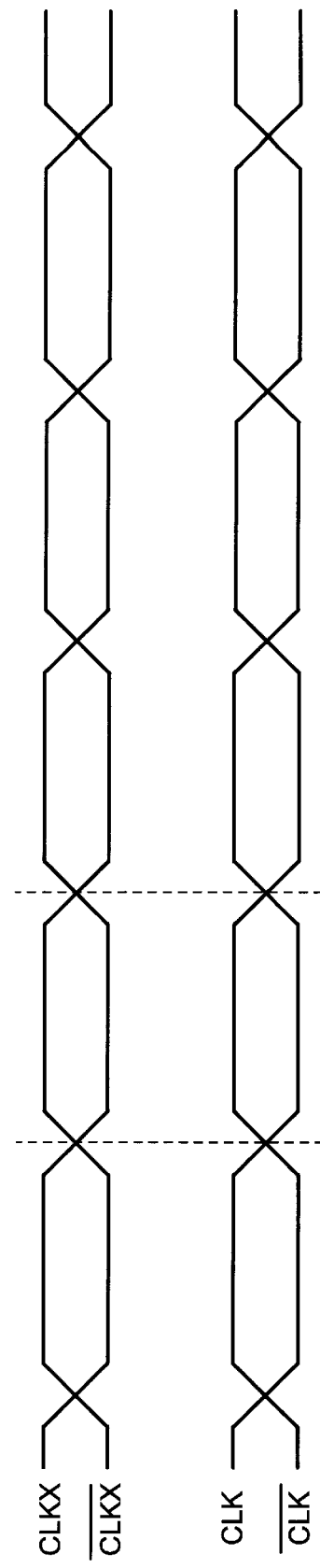

FIG. 4 shows that both the falling and rising edges have been aligned to the reference signal. The logic analyzer may now use the rising edge of signal CLK and the rising edge of its inverse signal CLK-BAR to sample the input data signals at effectively twice the rate of the clock signal.

Thus, has been described an arrangement which allows synchronous operation of a multichip logic analyzer system.

What is claimed is:

1. An arrangement for synchronizing both edges of an internally-generated clock signal to an external reference signal, comprising:
   a phase shifter chain including a plurality of stages; p1 a first comparison circuit for comparing said clock signal generated in said phase shifter chain to said reference signal and producing a first error signal in response to timing differences between rising edges of said clock signal and said reference signal; and
   a second comparison circuit for comparing said clock signal to said reference signal and producing a second error signal in response to timing differences between falling edges of said clock signal and said reference signal;
   said first and second error signals being applied to control inputs of said phase shifter chain to control delay in each of said stages to reduce said error with respect to each edge.

2. The arrangement of claim 1 in which each of said first and second comparison circuits includes a charge pump circuit.

3. A logic analyzer employing oversampling of an input data signal, comprising:
   an arrangement for synchronizing both edges of an internally-generated clock signal to an external reference signal, including
   a phase shifter chain including a plurality of stages;
   a first comparison circuit for comparing said clock signal generated in said phase shifter chain to said reference signal and producing a first error signal in response to timing differences between rising edges of said clock signal and said reference signal; and
   a second comparison circuit for comparing said clock signal to said reference signal and producing a second error signal in response to timing differences between falling edges of said clock signal and said reference signal;
   said first and second error signals being applied to control inputs of said phase shifter chain to control delay in each of said stages to reduce said error with respect to each edge.

4. The logic analyzer of claim 3 in which each of said first and second comparison circuits includes a charge pump circuit.

5. A logic analyzer including a plurality of ASICs each of said ASICs including arrangement for synchronizing both edges of an internally-generated clock signal to an external reference signal, said arrangement comprising:

a phase shifter chain including a plurality of stages;

a first comparison circuit for comparing said clock signal generated in said phase shifter chain to said reference signal and producing a first error signal in response to timing differences between rising edges of said clock signal and said reference signal; and a second comparison circuit for comparing said clock signal to said reference signal and producing a second error signal in response to timing differences between falling edges of said clock signal and said reference signal;

said first and second error signals being applied to control inputs of said phase shifter chain to control delay in each of said stages to reduce said error with respect to each edge.

6. The arrangement of claim 5 in which each of said first and second comparison circuits includes a charge pump circuit.

7. A logic analyzer employing oversampling of an input data signal, comprising:

a plurality of ASICs for oversampling said input data signal, each of said ASICs including clock generating and amplifying circuitry; and an arrangement for synchronizing both edges of an internally-generated clock signal to an external reference signal, including a phase shifter chain including a plurality of stages;

a first comparison circuit for comparing said clock signal generated in said phase shifter chain to said reference signal and producing a first error signal in response to timing differences between rising edges of said clock signal and said reference signal; and a second comparison circuit for comparing said clock signal to said reference signal and producing a second error signal in response to timing differences between falling edges of said clock signal and said reference signal;

said first and second error signals being applied to control inputs of said phase shifter chain to control delay in each of said stages to reduce said error with respect to each edge.

8. The logic analyzer of claim 3 in which each of said first and second comparison circuits includes a charge pump circuit.

* * * * *